United States Patent
Herden et al.

(10) Patent No.: US 9,136,664 B2
(45) Date of Patent: Sep. 15, 2015

(54) METHOD FOR OPERATING A PUMP LIGHT SOURCE HAVING A DIODE LASER

(75) Inventors: Werner Herden, Gerlingen (DE); Manfred Vogel, Ditzingen (DE); Heiko Ridderbusch, Schwieberdingen (DE)

(73) Assignee: ROBERT BOSCH, Stuttgart (DE)

( * ) Notice: Subject to any disclaimer, the term of this patent is extended or adjusted under 35 U.S.C. 154(b) by 1295 days.

(21) Appl. No.: 12/303,725

(22) PCT Filed: Aug. 7, 2007

(86) PCT No.: PCT/EP2007/058186
§ 371 (c)(1),
(2), (4) Date: Jun. 6, 2011

(87) PCT Pub. No.: WO2008/022914
PCT Pub. Date: Feb. 28, 2008

(65) Prior Publication Data
US 2011/0235670 A1 Sep. 29, 2011

(30) Foreign Application Priority Data
Aug. 22, 2006 (DE) .......................... 10 2006 039 398

(51) Int. Cl.
*H01S 3/131* (2006.01)
*H01S 3/0941* (2006.01)
*F02P 23/04* (2006.01)
(Continued)

(52) U.S. Cl.
CPC ............. *H01S 3/09415* (2013.01); *F02P 23/04* (2013.01); *H01S 3/1312* (2013.01); *H01S 3/0602* (2013.01); *H01S 3/0627* (2013.01); *H01S 3/094053* (2013.01); *H01S 3/094076* (2013.01);*H01S3/1024* (2013.01); *H01S 3/10069* (2013.01); *H01S 3/113* (2013.01); *H01S 5/06804* (2013.01)

(58) Field of Classification Search
CPC .............. H01S 3/1312; H01S 3/09415; H01S 3/10069; H01S 3/0602
USPC ........................................................ 372/34
See application file for complete search history.

(56) References Cited

U.S. PATENT DOCUMENTS 4,930,901 A * 6/1990 Johnson et al. ................. 372/26
5,151,909 A * 9/1992 Davenport et al. ............. 372/22
(Continued)

FOREIGN PATENT DOCUMENTS

WO      WO 2005/028856      3/2005
WO      WO 2005/066488      7/2005

OTHER PUBLICATIONS

International Search Report, PCT/EP2007/058186, dated Nov. 13, 2007.

*Primary Examiner* — Tod T Van Roy
*Assistant Examiner* — Marcia Golub-Miller
(74) *Attorney, Agent, or Firm* — Kenyon & Kenyon LLP

(57) ABSTRACT

A method is for operating a pump light source having a diode laser, which provides a pump light, in particular for optical pumping of a laser device. The pump light source is activated in a first mode of operation such that the diode laser assumes a predefinable target temperature, which lies in a range of a maximum of the coefficient of absorption of the laser-active solid of the laser device. In a second mode of operation, following the first mode of operation, the pump light source is activated such that it generates pump light to build up a population inversion in the laser-active solid of the laser device. In a third mode of operation, following the second mode of operation, the pump light source is activated such that it generates pump light to activate a laser operation in the laser device.

10 Claims, 3 Drawing Sheets

(51) Int. Cl.
*H01S 3/06* (2006.01)
*H01S 3/094* (2006.01)
*H01S 3/10* (2006.01)
*H01S 3/102* (2006.01)
*H01S 3/113* (2006.01)
*H01S 5/068* (2006.01)

(56) References Cited

U.S. PATENT DOCUMENTS

| | | |
|---|---|---|
| 5,400,351 A | 3/1995 | Montgomery et al. |
| 5,854,805 A * | 12/1998 | Reid et al. ................. 372/70 |
| 5,926,495 A | 7/1999 | Guch |
| 7,810,462 B2 * | 10/2010 | Herden et al. ............ 123/143 B |
| 8,155,160 B2 * | 4/2012 | Herden et al. ................. 372/30 |
| 8,355,415 B2 * | 1/2013 | Herden et al. ................. 372/10 |
| 8,656,879 B2 * | 2/2014 | Ridderbusch ............ 123/143 B |
| 8,707,921 B2 * | 4/2014 | Ridderbusch ............ 123/143 B |
| 8,761,212 B2 * | 6/2014 | Weinrotter et al. ............ 372/10 |
| 2003/0156606 A1 * | 8/2003 | Althaus et al. ............ 372/29.02 |
| 2006/0018350 A1 | 1/2006 | Adams et al. |
| 2007/0064746 A1 | 3/2007 | Winklhofer et al. |
| 2010/0282196 A1 * | 11/2010 | Ridderbusch ............ 123/143 B |

\* cited by examiner

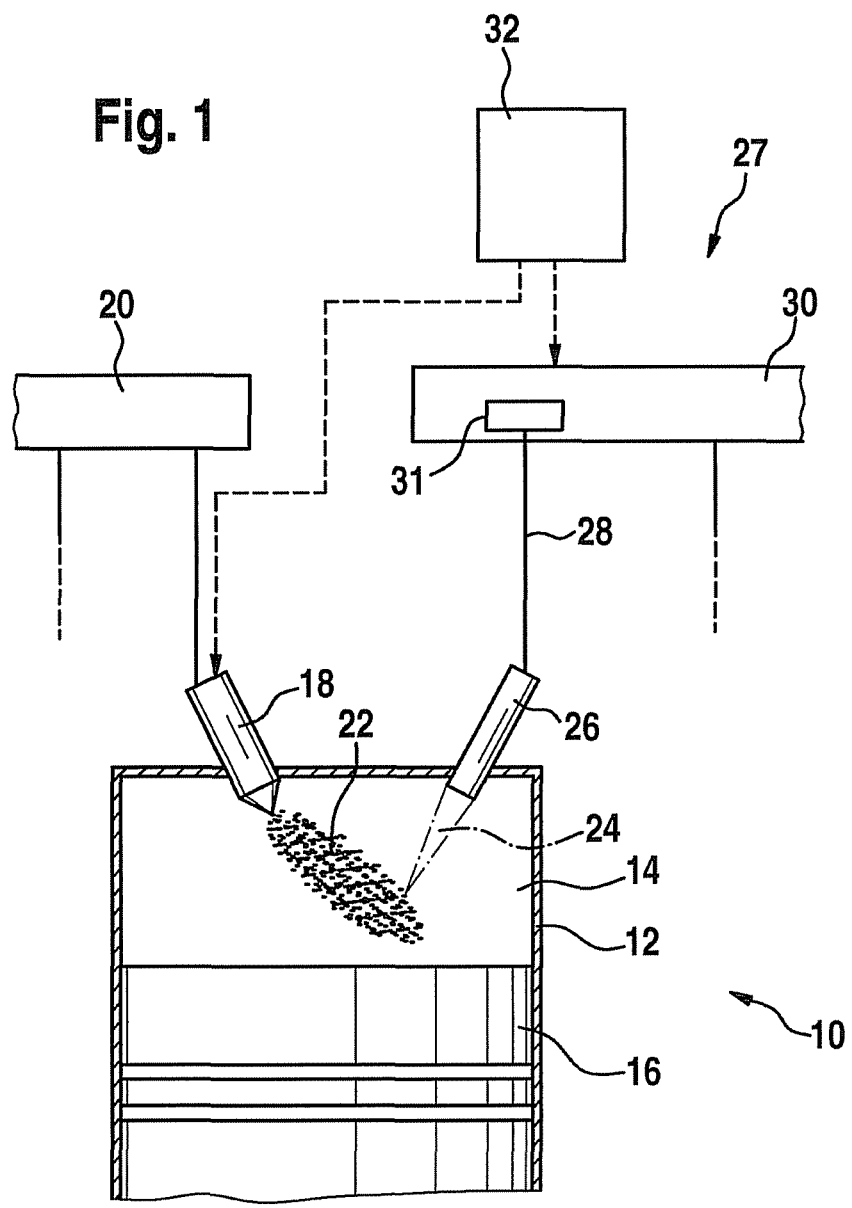

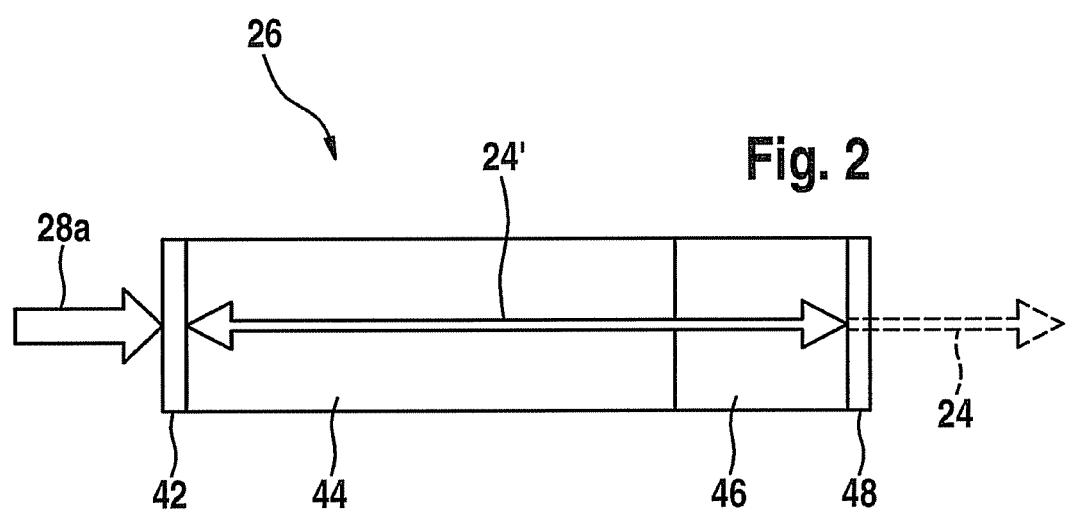

METHOD FOR OPERATING A PUMP LIGHT SOURCE HAVING A DIODE LASER

FIELD OF THE INVENTION

The present invention relates to a method for operating a pump light source having a diode laser, which provides a pump light, in particular for the optical pumping of a laser device.

BACKGROUND INFORMATION

Methods of this type are conventional and typically include active cooling and/or heating of the diode laser or the pump light source to stabilize the wavelength of the pump light for operation, which is a function of the temperature of the diode laser. The temperature control of the diode laser may be performed, for example, by Peltier elements or also by using a water cooling system. However, an effort of this type for temperature control of the diode laser is not cost-effective in many areas of application, in particular if the pump light source is used in the motor vehicle field.

SUMMARY

Example embodiments of the present invention provide an operating method of the type cited at the outset such that increased stability of the wavelength of the pump light generated by the pump light source is ensured even without the use of active temperature control of the pump light source or the diode laser contained therein.

In a method according to example embodiments of the present invention, the pump light source is activated in a first mode of operation such that the diode laser assumes a predefinable target temperature.

The activation of the pump light source in the first mode of operation advantageously causes a temperature control of the diode laser with exploitation of the electrical power which is supplied to the pump light source upon its activation, so that the diode laser may assume a desired target temperature even without the use of active heating or cooling device(s). It is thus ensured in a particularly simple manner by the operating method that the wavelength of the pump light, which is a function of the temperature of the diode laser, has a desired and/or predefinable value for the further operation of the pump light source and may also maintain this value.

In contrast to complex active temperature control in typical systems, which requires corresponding auxiliary components such as a coolant loop or a Peltier element, the operating method described herein advantageously solely provides a separate activation of the pump light source in the first mode of operation to bring the diode laser to the predefinable target temperature and thus also to the corresponding wavelength.

According to example embodiments of the present invention, an activation current and/or an activation time, for which the activation current is applied to the diode laser, is particularly advantageously predefined as a function of the target temperature. Pilot control of this type is sufficient in many cases in the event of a known starting temperature of the diode laser and possibly with knowledge of its heat capacity to achieve the target temperature with sufficient precision.

To achieve particularly effective temperature control of the diode laser, the activation current is selected such that it is in the range of a threshold current of the diode laser. The activation current is preferably approximately less than or equal to double the threshold current. Particularly effective heating of the diode laser is possible upon applying an activation current of this type.

The target temperature for the diode laser may be achieved particularly precisely by regulation according to an example embodiment of the present invention.

The temperature of the diode laser may advantageously be ascertained easily using a thermocouple in thermal contact with the diode laser. Furthermore, it is possible to derive the temperature of the diode laser from an electrical resistance of the diode laser, which may be ascertained during activation of the diode laser, for temple. A relationship between the temperature of the diode laser and the wavelength of the pump light emitted therefrom is advantageously obtained via a corresponding characteristic curve.

According to example embodiments of the present invention, it is provided that, for the effective generation of pump light of a desired wavelength, the diode laser is activated in a second mode of operation, which is set in particular only after reaching the target temperature, to generate pump light, in particular using an activation current which is greater than the threshold current of the diode laser, and preferably is a multiple thereof. The diode laser is thus operated having an efficiency increased in relation to the first mode of operation.

Because of very simple temperature control by setting the activation parameters and the stability of a wavelength of the pump light accompanying this, a pump light source operated according to example embodiments of the present invention may be used very advantageously for the optical pumping of a laser device of an ignition device for an internal combustion engine, in particular of a motor vehicle, the laser device having a laser-active solid with a passive Q-switch. Due to the consistency of the wavelength of the pump light achievable according to example embodiments of the present invention, a time jitter of the generated laser pulses may advantageously be minimized in laser devices of this type, so that it is possible to maintain an ignition point more precisely.

To configure the pump light source in accordance with its area of application, a target temperature is advantageously predefined according to example embodiments of the present invention at which the pump light generated by the pump light source has a desired wavelength or a wavelength which lies in a range of a maximum of the coefficient of absorption of the laser-active solid of the laser device, so that particularly efficient pumping of the laser-active solid is possible.

Efficient pumping of the laser device is possible in that the pump light source is activated in a second mode of operation, following the first mode of operation, such that it generates pump light to build up a population inversion in the laser-active solid of the laser device. According to example embodiments of the present invention, the activation current and/or the activation time is particularly advantageously selected in the second mode of operation such that no laser operation results in the laser device, whereby it is ensured that a maximum population inversion is built up for the future generation of a laser pulse.

To keep the time jitter during the generation of a laser pulse by the laser device as low as possible, it is advantageously provided according to example embodiments of the present invention that in a third mode of operation, following the second mode of operation, the pump light source is activated such that it generates pump light to activate a laser operation in the laser device. The separation according to example embodiments of the present invention between the second and third modes of operation advantageously allows the reliable generation of a laser pulse solely during the activation time of the third mode of operation, the corresponding activation time advantageously being able to be selected comparatively low, so that an effective reduction of the time jitter during the generation of the laser pulse results. The reliable activation of the laser operation in the third mode of operation is ensured according to example embodiments of the present invention in that an activation current in the third mode of operation is greater than an activation current of the second mode of operation.

The implementation of the operating method according to example embodiments of the present invention in the form of a computer program, which is storable on an electronic storage medium and may be assigned to a control unit which executes the operating method and/or to an arithmetic device of a control unit of this type, is of particular significance.

Further features, possible applications, and advantages of example embodiments of the present invention result from the following description, which are shown in the figures of the drawing. All features described or shown form the subject matter hereof alone or in any combination, independently of their wording and independently of their formulation or representation in the description and in the drawings.

BRIEF DESCRIPTION OF THE DRAWINGS

FIG. 1 shows a schematic illustration of an internal combustion engine having a pump light source operated according to example embodiments of the present invention, FIG. 2 shows an example embodiment of an ignition device of the internal combustion engine from FIG. 1.

DETAILED DESCRIPTION

Figure 3A:
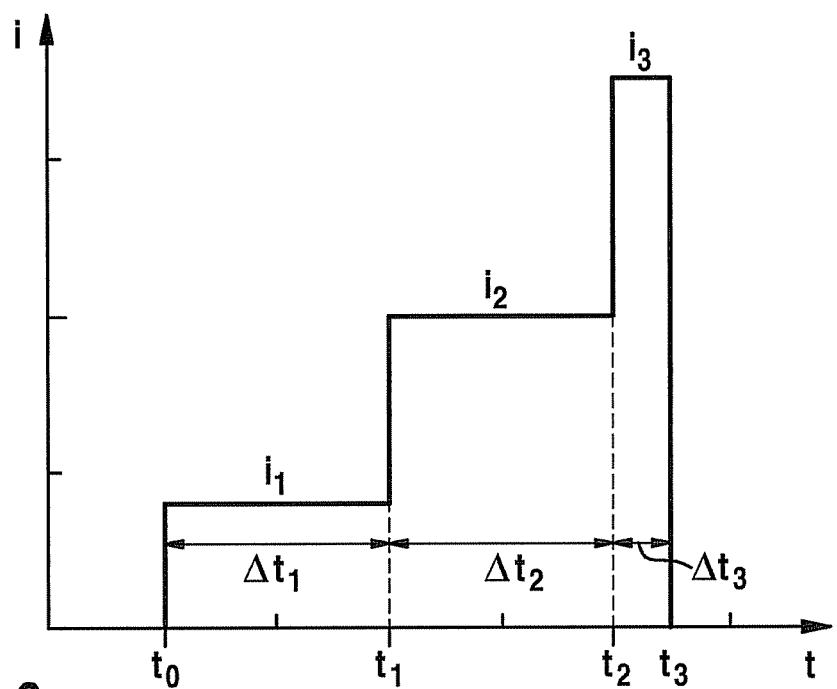
FIG. 3a shows the time curve of an activation current for the pump light source according to example embodiments of the present invention.

An internal combustion engine bears reference numeral 10 as a whole in FIG. 1. It is used for driving a motor vehicle. Internal combustion engine 10 includes multiple cylinders, only one of which is identified in FIG. 1 by reference numeral 12. A combustion chamber 14 of cylinder 12 is delimited by a piston 16. Fuel reaches combustion chamber 14 directly through an injector 18, which is connected to a fuel-pressure accumulator 20, also referred to as a rail or common rail.

Fuel 22 injected into combustion chamber 14 is ignited using a laser pulse 24, which is emitted by an ignition device 27, including a laser device 26, into combustion chamber 14. For this purpose, laser device 26 is supplied via a fiber optic device 28 with a pump light, which is provided by a pump light source 30. Pump light source 30 has a diode laser 31 for generating the pump light, which is assigned directly to fiber optic device 28, as is obvious from FIG. 1, for example. Pump light source 30 and/or diode laser 31 are/is activated by a control unit 32, which also activates injector 18.

FIG. 2 schematically shows a detail view of laser device 26 from FIG. 1.

As is apparent from FIG. 2, laser device 26 has a laser-active solid 44, from which passive Q-switch 46 is optically downstream. Laser-active solid 44, together with passive Q-switch 46 and coupling mirror 42 and decoupling mirror 48, situated left thereof in FIG. 2, forms a laser oscillator in this case whose oscillation behavior is a function of passive Q-switch 46 in a known manner.

In the configuration shown in FIG. 2, laser device 26 or laser-active solid 44 is supplied with pump light 28a through coupling mirror 42 such that electrons are excited in laser-active solid 44 and correspondingly result in a population inversion. Pump light 28a is supplied to laser device 26—as already described above with reference to FIG. 1—via fiber optic device 28, which optically connects diode laser 31 to laser device 26.

While passive Q-switch 46 has its idle state, in which it has a comparatively low coefficient of transmission, laser operation is avoided in laser-active solid 44 or in solids 44, 46 delimited by coupling mirror 42 and decoupling mirror 48. With increasing pump time, i.e., during supply with pump light 28a, the radiation intensity in laser oscillator 42, 44, 46, 48 also rises, however, so that passive Q-switch 46 finally bleaches out. This means that its coefficient of transmission rises and laser operation begins in laser oscillator 42, 44, 46, 48. This state is symbolized by double arrow 24'.

In the manner described above, a laser pulse 24 is created, also referred to as a giant pulse, which has a comparatively high peak power. Laser pulse 24 is coupled, possibly using a further fiber optic device, or also directly through a combustion chamber window of laser device 26, into combustion chamber 14 (FIG. 1) of internal combustion engine 10, so that fuel 22 or an air/fuel mixture present therein is ignited.

To allow the reliable generation of laser pulse 24 and thus also reliable ignition of the air/fuel mixture in combustion chamber 14 of internal combustion engine 10, the operating method according to example embodiments of the present invention provides that pump light source 30 (FIG. 1) is activated in a first mode of operation such that diode laser 31 assumes a predefinable target temperature.

It is thus advantageously ensured that the wavelength of pump light 28a, which is a function of the temperature of diode laser 31, also has a predefinable value and defined pumping of laser device 26 using pump light 28a is possible.

The operating method according to example embodiments of the present invention thus particularly advantageously does not require active cooling and/or heating devices for temperature control of diode laser 31, but rather the activation of pump light source 30 or diode laser 31 is exploited directly to control the temperature of diode laser 31.

FIG. 3a shows the time curve of an activation current i for diode laser 31 according to an exemplary embodiment of the present invention.

The activation of diode laser 31 according to example embodiments of the present invention has a total of three different phases or modes of operation according to the diagram from FIG. 3a.

According to example embodiments of the present invention, pump light source 30 or diode laser 31 is activated in a first mode of operation in such a way that diode laser 31 assumes a predefinable target temperature and thus also outputs pump light 28a of a known wavelength corresponding to the target temperature.

For this purpose, an activation current $i_1$ is applied to diode laser 31 starting from point in time $t_0$, as shown in FIG. 3a. This activation of diode laser 31 lasts until a point in time $t_1$, at which diode laser 31 has assumed a predefinable target temperature corresponding to the desired wavelength of pump light 28a. Activation time $\Delta t_1$ for the first mode of operation of the method according to example embodiments of the present invention is defined in this manner.

Figure 3B:
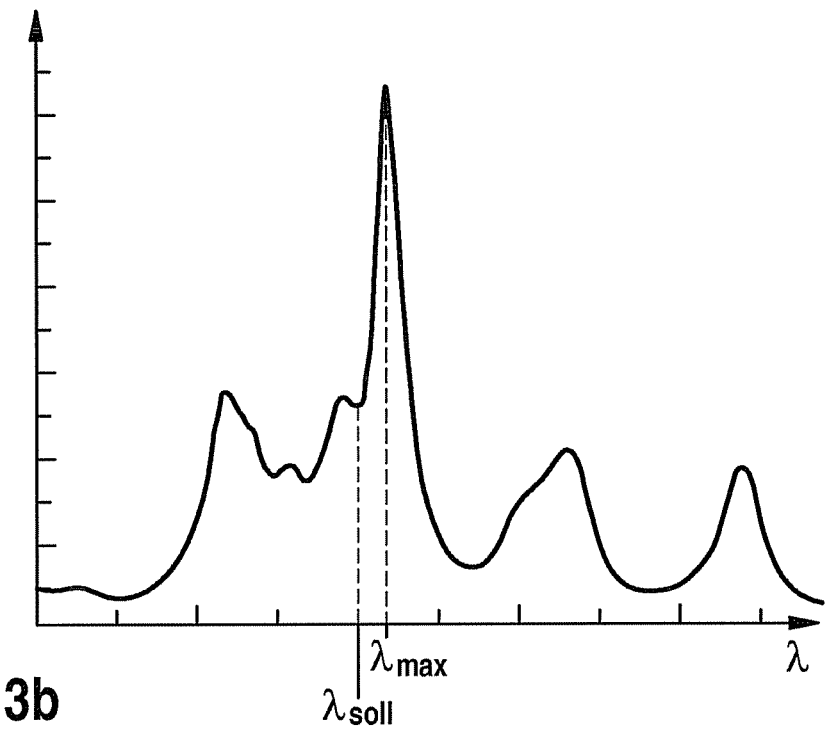
FIG. 3b shows the curve of a coefficient of absorption of a laser-active solid of the laser device from FIG. 2 plotted over the wavelength.

The application to diode laser 31 according to example embodiments of the present invention with activation current during activation time $\Delta t_1$ of the first mode of operation has the result that pump light 28a emitted by diode laser 31 has a desired wavelength $\lambda_{setpoint}$, see FIG. 3b, which reproduces a coefficient of absorption of laser-active solid 44 via wavelength λ.

Desired wavelength $\lambda_{setpoint}$ is selected such that it lies in the immediate range of a wavelength $\lambda_{max}$, preferably in particular below wavelength $\lambda_{max}$, at which laser-active solid 44 (FIG. 2) of laser device 26 has its maximum coefficient of absorption for pump light 28a, see FIG. 3b.

Desired wavelength $\lambda_{setpoint}$ is therefore very particularly advantageously predefined in such a way that it is below wavelength $\lambda_{max}$, because active cooling is not possible by the operating method according to example embodiments of the present invention—except by the absence of activation—and further heating of diode laser 31 is to be expected solely due to the activation using activation currents $i_2$, $i_3$ during the further modes of operation in the time range $t > t_1$ (FIG. 3a).

It is thus ensured that after ending the first mode of operation, i.e., from $t = t_1$, the wavelength of pump light 28a increases in accordance with the temperature increase of diode laser 31 caused by the activation using activation current $i_2$, $i_3$ and thus enters the immediate range of wavelength $\lambda_{max}$ of the absorption maximum of laser-active solid 44. It is thus advantageously ensured according to example embodiments of the present invention that during the second mode of operation and associated activation time $\Delta t_2$ (FIG. 3a), the most efficient possible pumping of laser device 26 by the pump light 28a generated by diode laser 31 is possible.

Activation time $\Delta t_2$ and activation current $i_2$ for the second mode of operation are advantageously selected, according to example embodiments of the present invention such that a population inversion builds up in laser-active solid 44 of laser device 26, and laser operation still does not yet result during the second mode of operation. Corresponding values for activation current $i_2$ and activation time $\Delta t_2$ may be ascertained from external measurements for a predefined laser device 26 and obtained via a relationship stored in control unit 32 in the form of a characteristics map.

Only the third mode of operation according to example embodiments of the present invention, in which diode laser 31 is activated over activation time $\Delta t_3$ using activation current $i_3$, is provided for the purpose of activating the laser operation in laser-active solid 44 of laser device 26 and thus triggering the generation of laser pulse 24.

Through the separation according to example embodiments of the present invention between the buildup of the population inversion during the second mode of operation and the triggering of laser pulse 24 during the third mode of operation, the possibility is advantageously provided of minimizing the time jitter during the generation of laser pulse 24. Because the activation of diode laser 31 in the second mode of operation intentionally avoids the activation of the laser operation, it is ensured that at point in time $t_2$, a sufficient population inversion exists in laser-active solid 44, so that the short-term application to laser device 26 with pump light 28a, which has a comparatively large intensity corresponding to large activation current $i_3$, activates the laser operation.

This means that the time jitter during the generation of laser pulse 24 is advantageously restricted to activation time $\Delta t_3$ during the third mode of operation.

Particularly efficient temperature control and/or heating of diode laser 31 is achievable in the first mode of operation in that activation current i is selected such that it has values which lie in the range of the threshold current of diode laser 31. This means that during the first mode of operation, diode laser 31 is advantageously operated according to example embodiments of the present invention such that it does not have maximum efficiency in regard to the generation of pump light 28a, but rather experiences rapid heating by the activation energy supplied thereto. Activation current $i_1$ may also be selected to be smaller than the threshold current, but preferably does not exceed double the threshold current of diode laser 31.

A temperature of diode laser 31 may advantageously be ascertained in a conventional manner by an integrated thermocouple or a thermocouple in thermal contact with diode laser 31. Alternatively or additionally thereto, it is also possible to derive the temperature of diode laser 31 from an electrical resistance which may be ascertained from activation current i and a voltage used for activating diode laser 31.

The relationship between the temperature of diode laser 31 and a wavelength λ of pump light 28a output by diode laser 31 is advantageously contained in a characteristic curve which may be stored in control unit 32.

If a thermal capacity of diode laser 31 and/or the components in thermal contact therewith are/is sufficiently known, it may be sufficient for temperature control according to example embodiments of the present invention of diode laser 31 to provide a corresponding control during the first mode of operation. Alternatively thereto, diode laser 31 may also be regulated to the target temperature.

To avoid unnecessary heat losses during temperature control of diode laser 31, activation current $i_1$ is preferably selected to be as large as possible within the limits described above during the first mode of operation, so that rapid heating results. It is also advantageous if the second and possibly the third modes of operation directly follow the first mode of operation over time, to avoid undesired cooling of diode laser 31 and thus a renewed change, in particular a decrease, in wavelength λ of pump light 28a.

Targeting cooling of diode laser 31 may also be performed according to example embodiments of the present invention in that diode laser 31 is, for example, no longer activated at all for a corresponding waiting time. Within this waiting time, the temperature of diode laser 31 is advantageously periodically checked to be able to establish the possibility of putting diode laser 31 back into operation using the lowest possible latency time.

Although the operating method according to example embodiments of the present invention has been described above on the basis of an ignition device for an internal combustion engine 10, the operating method according to example embodiments of the present invention may also be used in ignition devices for stationary engines.

The principle according to example embodiments of the present invention of temperature control of pump light source 30 solely by corresponding activation of pump light source 30 and/or a diode laser 31 contained therein may be applied to any pump light source 30 containing a diode laser 31, i.e., in particular also to those laser light sources which are not used as a pump light source. Through the "implicit" temperature control of diode laser 31 according to example embodiments of the present invention using a corresponding activation, a possibility for temperature control and thus for setting the wavelength of diode laser 31 which may be implemented very simply is advantageously provided.

What is claimed is:

1. A method for operating a pump light source having a diode laser, which provides a pump light for optical pumping of a laser-active solid of a laser device, comprising:
   activating the pump light source in a first mode of operation such that the diode laser assumes a predefinable target temperature,
   wherein the first mode of operation includes at least a heating of the diode laser by an activation current, wherein the activation current is selected such that it is in a range of a threshold current of the diode laser, and such that the pump light source does not have a maximum efficiency in generation of pump light, and wherein the target temperature is predefined at which the pump light generated by the pump light source has a wavelength that lies in a range of a maximum of a coefficient of absorption of a laser-active solid of a laser device located downstream of the pump light source;

activating the pump light source in a second mode of operation, consecutive to the first mode of operation, such that it generates pump light to build up a population inversion in the laser-active solid of the laser device, but no laser operation results in the laser device wherein an activation current in the second mode of operation is greater than the threshold current of the diode laser;

activating the pump light source in a third mode of operation, consecutive to the second mode of operation, such that it generates pump light to activate a laser operation in the laser device, wherein an activation current in the third mode of operation is greater than an activation current in the second mode of operation.

2. The method according to claim 1, wherein an activation time is predefined.

3. The method according to claim 1, wherein an activation time is predefined as a function of the target temperature.

4. The method according to claim 2, wherein the activation current in the first mode of operation being less than or equal to double the threshold current.

5. The method according to claim 1, wherein the temperature of the diode laser is at least one of (a) ascertained using a thermocouple which is in thermal contact with the diode laser and (b) derived from an electrical resistance of the diode laser.

6. The method according to claim 1, wherein the diode laser is activated in the second mode of operation, which is set only after reaching the target temperature, to generate pump light using an activation current which is a multiple of the threshold current of the diode laser.

7. The method according to claim 1, wherein the pump light source is used for optical pumping of the laser device of an ignition device for at least one of (a) an internal combustion engine and (b) an internal combustion engine of a motor vehicle, the laser device having a laser-active solid having a passive Q-switch.

8. The method according to claim 7, wherein at least one of (a) the activation current and (b) an activation time in the second mode of operation is selected such that no laser operation results in the laser device.

9. The method according to claim 7, wherein an activation time in the third mode of operation is less than an activation time in the second mode of operation.

10. The method according to claim 1, wherein a relationship between the temperature of the diode laser and the wavelength of the pump light is obtained from a characteristic curve.

* * * * *